United States Patent
Pan et al.

(10) Patent No.: US 9,360,224 B2
(45) Date of Patent: Jun. 7, 2016

(54) AIR CONDITION SYSTEM

(71) Applicant: Wistron Corporation, New Taipei (TW)

(72) Inventors: Chun-Hung Pan, New Taipei (TW);
Shue-Liang Lin, New Taipei (TW);
Ming-Chang Wu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 330 days.

(21) Appl. No.: 13/927,080

(22) Filed: Jun. 25, 2013

(65) Prior Publication Data

US 2014/0083658 A1 Mar. 27, 2014

(30) Foreign Application Priority Data

Sep. 26, 2012 (TW) .............................. 101135313 A (51) Int. Cl.
*F24F 1/00* (2011.01)
*H05K 7/20* (2006.01)

(52) U.S. Cl.
CPC .......... *F24F 1/0059* (2013.01); *H05K 7/20745* (2013.01)

(58) Field of Classification Search
CPC .... F24F 1/0059; F24F 13/08; H05K 7/20709; H05K 7/20718; H05K 7/20745
USPC ......................................... 62/180, 186, 259.2
See application file for complete search history.

(56) References Cited

U.S. PATENT DOCUMENTS

| | | | |
|---|---|---|---|
| 7,551,971 B2 | 6/2009 | Hillis | |
| 7,724,513 B2 | 5/2010 | Coglitore | |
| 2007/0227170 A1* | 10/2007 | Peng | 62/259.2 |
| 2010/0107658 A1 | 5/2010 | Cockrell | |
| 2012/0048514 A1 | 3/2012 | Osbaugh | |

FOREIGN PATENT DOCUMENTS

| | | |
|---|---|---|
| CN | 101963378 A | 2/2011 |
| CN | 201976393 U | 9/2011 |
| CN | 202141956 U | 2/2012 |
| CN | 202282922 U | 6/2012 |

OTHER PUBLICATIONS

Office action mailed on Apr. 28, 2015 for the Taiwan application No. 101135313, filing date: Sep. 26, 2012, p. 3 line 3-26 and p. 4 line 1-14.
Office action mailed on Nov. 3, 2015 for the China application No. 201210384425.8, p. 3 line 4-39 and p. 4 line 1-32.

* cited by examiner

*Primary Examiner* — Marc Norman
(74) *Attorney, Agent, or Firm* — Winston Hsu; Scott Margo (57) ABSTRACT

An air condition system includes a casing, a first heat exchanger, a fan and a second heat exchanger. A host is held by the casing. The first heat exchanger is disposed inside the casing. Air flows into the casing, and is processed by the first heat exchanger. Then, the air processed by the heat exchange procedure flows forward the host. The fan exhausts the air passing through the host. The second heat exchanger disposed on the fan and inside the casing. The air exhausted by the fan is processed by the second heat exchanger, and flows out of the casing by wind force of the fan.

17 Claims, 8 Drawing Sheets

AIR CONDITION SYSTEM

BACKGROUND OF THE INVENTION

1. Field of the Invention

The present invention relates to an air condition system, and more particularly, to an air condition system capable of effectively economizing power consumption.

2. Description of the Prior Art

In progress of computers and network, servers are utilized widely in common industry. A rack server has an advantage of small size so as to be arranged conveniently in a machine room. The rack servers are always piled up and neighboring with other servers, and the rack servers always operate for a long time. It is very important to dissipate heat generate by the rack server efficiently for stability and service life thereof. In general, the rack server is assembled inside the casing and put on the room. The room or the casing includes two fans respectively to guide the cold air from the evaporator heat exchanger toward the server and to dissipate heat out of the server. Further, the servers can be stacked up inside the container room for crowded arrangement, and preferred heat dissipation of the server rack becomes an important issue in the server industry.

Figure 1:
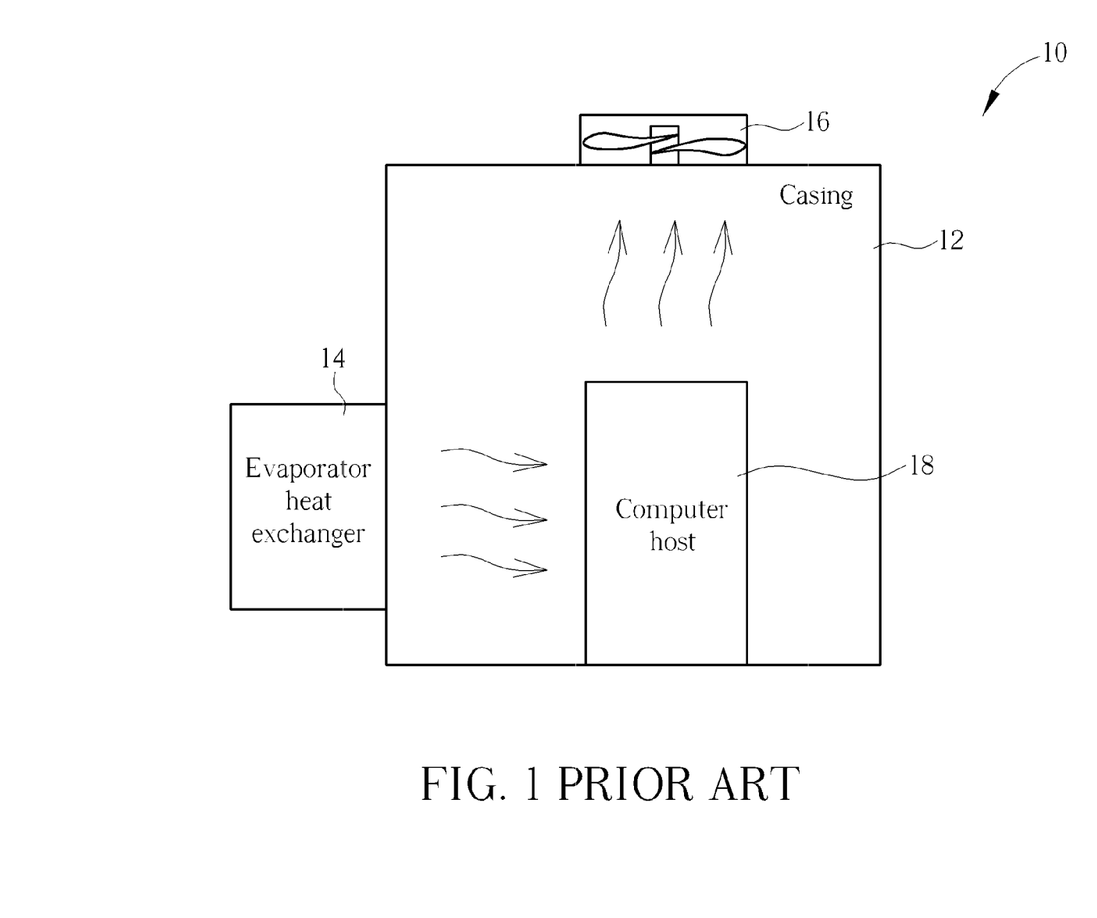
FIG. 1 is a diagram of an air condition system in the prior art.

Please refer to FIG. 1. FIG. 1 is a diagram of an air condition system 10 in the prior art. The conventional air condition system 10 includes a casing 12, an evaporator heat exchanger 14, a fan 16 and a computer host 18. The computer host 18 is disposed inside the casing 12. The evaporator heat exchanger 14 and the fan 16 are disposed outside the casing 12. The conventional air condition system 10 is a cooling air condition system. Heat is generated by the computer host 18 and filled inside the casing 12. The fan 16 can exhaust the heat air by the computer host 18 out of the casing 12, and the evaporator heat exchanger 14 can guide the cold air into the casing 12, so as to cool air temperature inside the casing 12 and to improve operation efficiency of the computer host 18.

Figure 2:
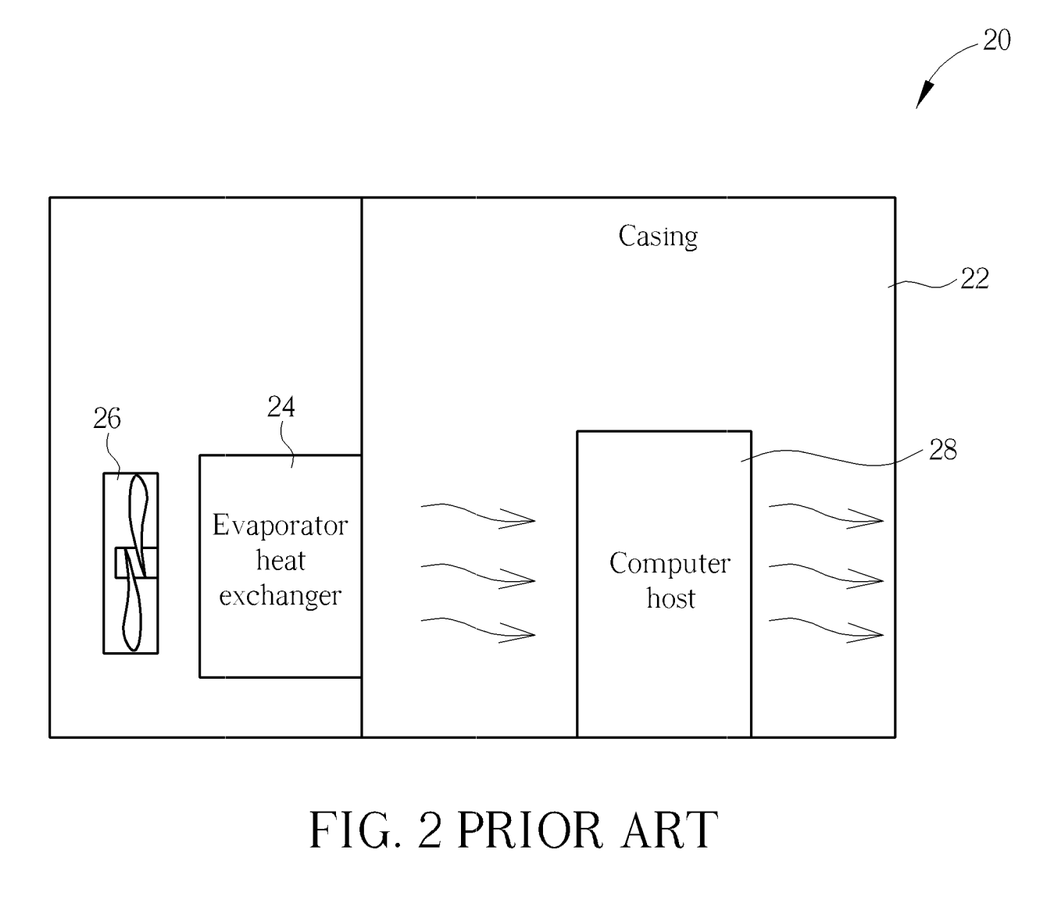
FIG. 2 is a diagram of the air condition system in another prior art.

Please refer to FIG. 2. FIG. 2 is a diagram of an air condition system 20 in another prior art. The conventional air condition system 20 includes a casing 22, an evaporator heat exchanger 24, a fan 26 and a computer host 28. The casing 22 has two chambers. The computer host 28 is disposed inside one of the chambers, and the evaporator heat exchanger 24 and the fan 26 are disposed inside the other chamber. A plurality of holes (not shown in figure) is formed on a surface of the casing 22 relative to the evaporator heat exchanger 24. When heat is generated by the computer host 28 and filled inside the casing 22, the fan 26 guides cold air from the evaporator heat exchanger 24 into the casing 22 for cooling the computer host 28, and the hold air inside the casing 22 can be exhausted out of the casing 22 via the holes.

Figure 3:
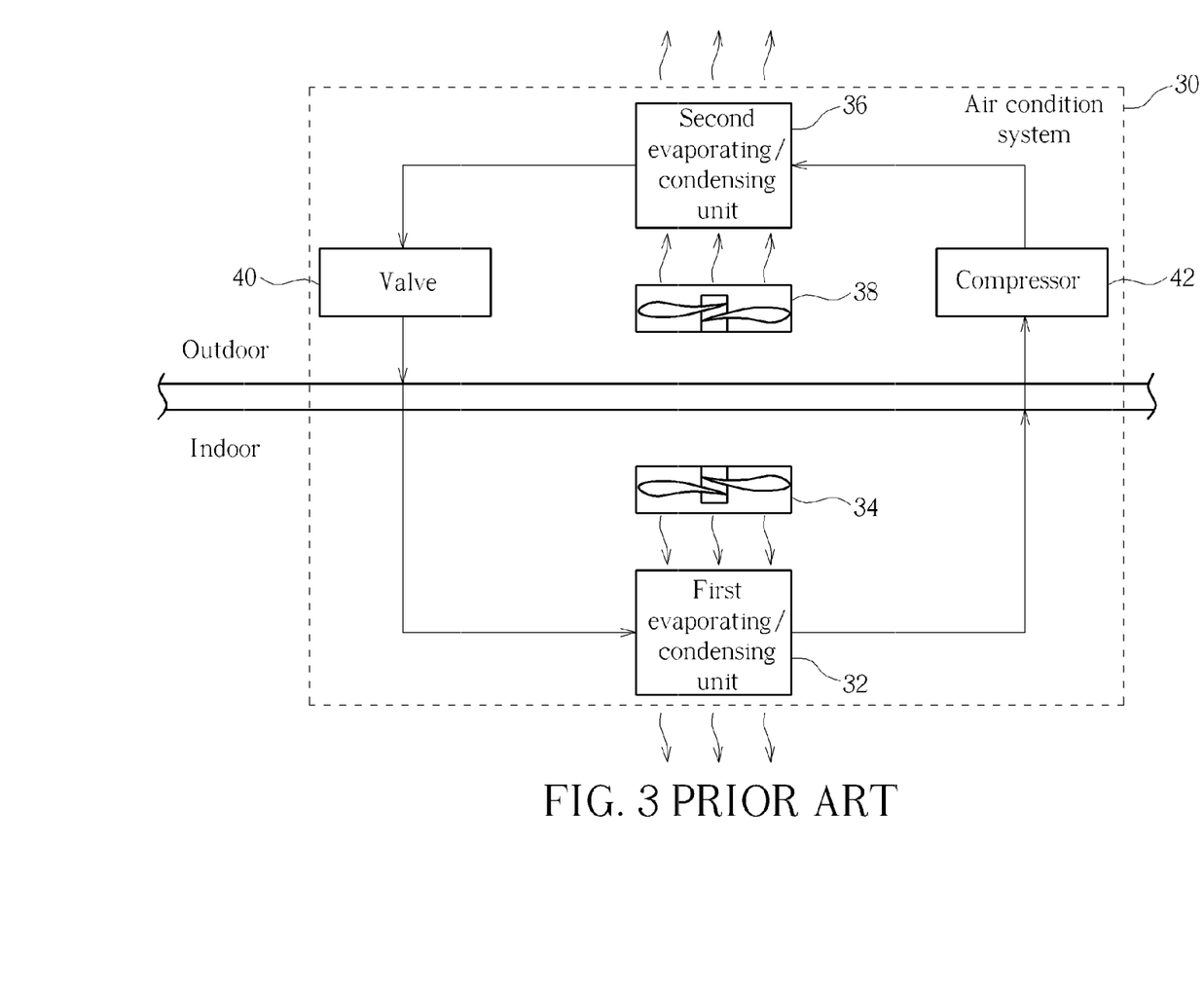
FIG. 3 and FIG. 4 respectively are diagrams of the air condition system in different modes in another prior art.
Figure 4:
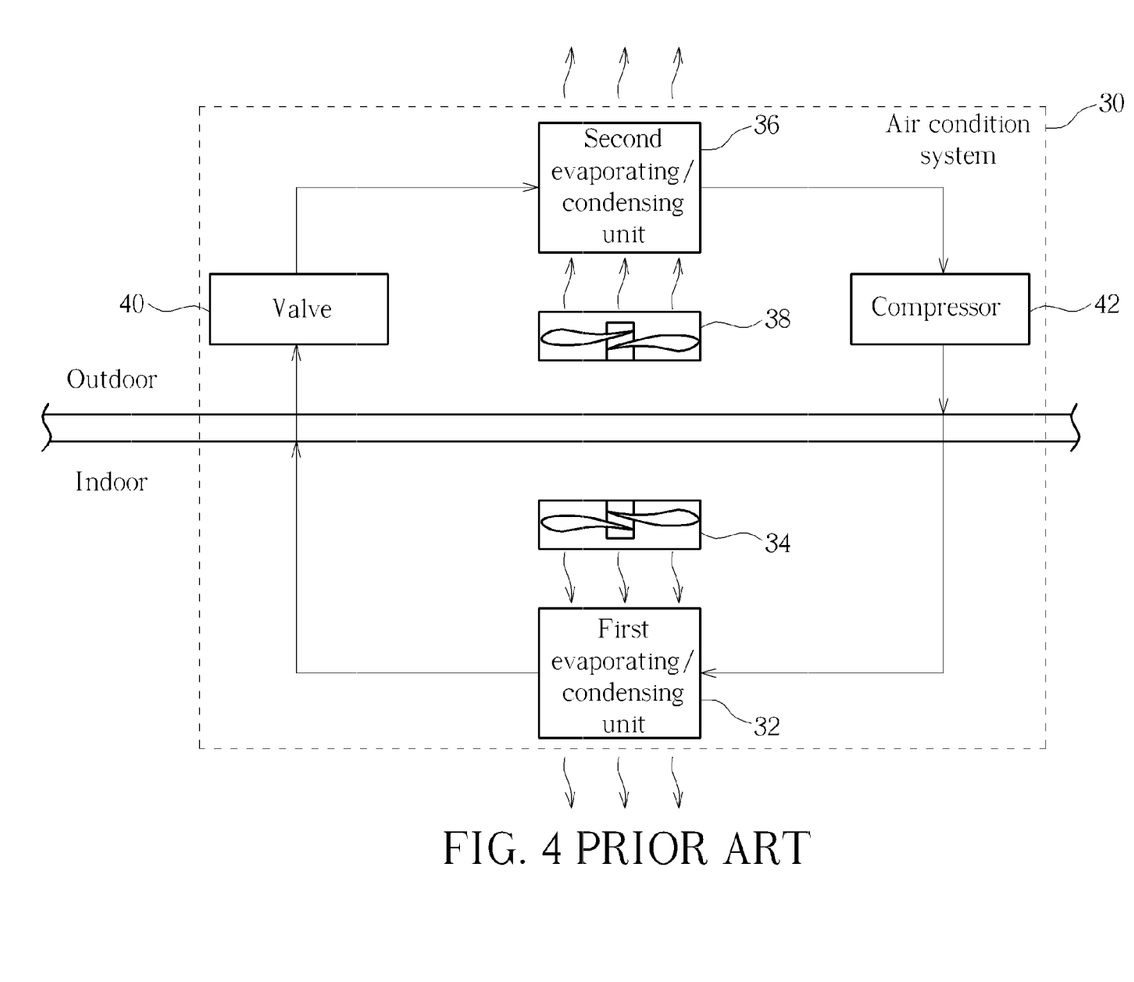

Please refer to FIG. 3 and FIG. 4. FIG. 3 and FIG. 4 respectively are diagrams of an air condition system 30 in different modes in another prior art. The conventional air condition system 30 includes a first evaporating/condensing unit 32, a first fan 34, a second evaporating/condensing unit 36, a second fan 38, a valve 40 and a compressor 42. The valve 40, the compressor 42 and related system are the coolant compression circulatory system. The first evaporating/condensing unit 32 and the first fan 34 are disposed on indoor location, the second evaporating/condensing unit 36 and the second fan 38 are disposed on outdoor location.

As shown in FIG. 3, the valve 40 guides the low-pressure and low-temperature fluid to the first evaporating/condensing unit 32 for heat absorption when cooling operation of the conventional air condition system 30 is executed, so that the first fan 34 can exhaust the cold air out of the casing (not shown in figures) of the conventional air condition system 30. The compressor 42 guides the high-pressure and high-temperature fluid from the first evaporating/condensing unit 32 to the second evaporating/condensing unit 36, and the second fan 38 exhausts the hot air toward outdoors.

As shown in FIG. 4, the compressor 42 guides the high-pressure and high-temperature fluid from the second evaporating/condensing unit 36 to the first evaporating/condensing unit 32 for heat liberation when heating operation of the conventional air condition system 30 is executed. The first fan 34 exhausts the hot air to the indoor, and the valve 40 guides the low-pressure and low-temperature fluid toward the second evaporating/condensing unit 36 for the heat absorption. Thus, the compressor 42 of the conventional air condition system 30 can transfer the fluid between the first evaporating/condensing unit 32 to the second evaporating/condensing unit 36 by closed circulation, and switches functional modes of the evaporating/condensing units to generate the cold air and the hot air.

As mentioned above, the conventional air condition system 10 and the conventional air condition system 20 utilize one heat exchanger (the evaporators 14 and 24) to cool the air, and then utilize the fan to exhaust the cold air into the casings 12 and 22 for cooling the computer hosts 18 and 28. The conventional air condition system 10 and the conventional air condition system 20 have no condensing function and humidity adjustment, are not suitable to high humidity district. The conventional air condition system 30 is the normal skill. Two heat exchangers of the conventional air condition system 30 are respectively disposed indoor and outdoor, and each heat exchanger has the fan to flow the fluid by the closed circulation for temperature adjustment.

Figure 5:
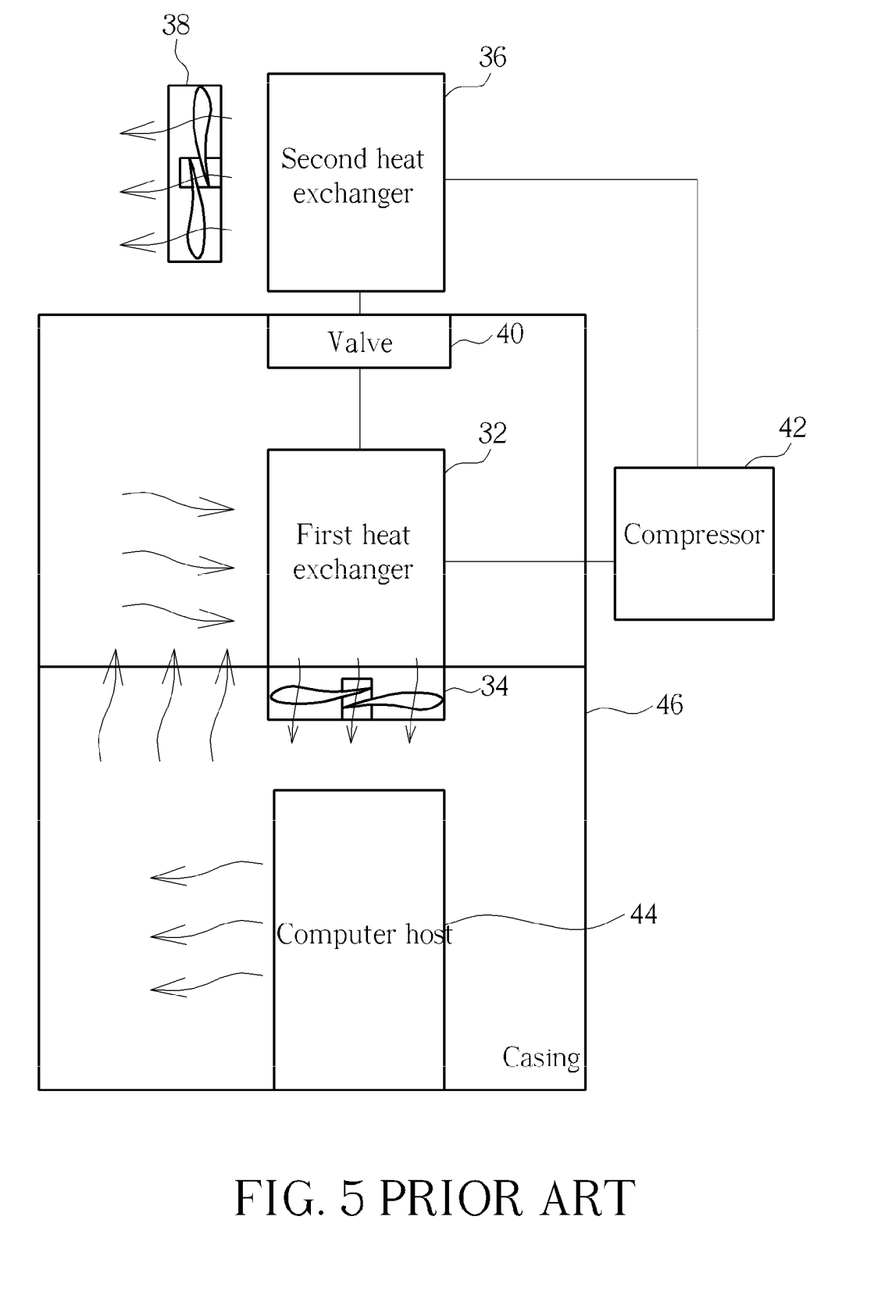
FIG. 5 is a diagram of an application of the conventional air condition system in the prior art.

Please refer to FIG. 5. FIG. 5 is a diagram of an application of the conventional air condition system 30 in the prior art. The computer host 44 and the first heat exchanger 32 (the evaporating/condensing unit) are disposed inside the casing 46, the second heat exchanger 36 (the evaporating/condensing unit) is disposed outside the casing 46. The air from the first heat exchanger 32 can form an inner circulation inside the casing 46 by the first fan 34, so as to adjust the operational temperature of the computer host 44. The second heat exchanger 36 utilizes the second fan 38 to liberate heat toward the surrounding air, and heat exchange is not executed between the surrounding air and the air inside the casing 46.

Therefore, the conventional air condition system 30 utilizes two fans to circulate the fluid for heat transmission and temperature adjustment. The conventional air condition system 30 has drawbacks of huge volume, expensive apparatus cost and operation cost (high power consumption), and limitation of service life according to the fan. Design of an air condition system capable of decreasing cost and widely applied to the tropical district and the frigid district for environment-friendly protection is an important issue for preferred market competition.

SUMMARY OF THE INVENTION

The present invention provides an air condition system capable of effectively economizing power consumption for solving above drawbacks.

According to the claimed invention, an air condition system includes a casing, a first heat exchanger, a fan and a second heat exchanger. A host is disposed inside the casing. The first heat exchanger is disposed inside the casing. The first heat exchanger guides air from outward environment into the casing for heat exchange procedure, and the air processed by the heat exchange procedure flows toward the host. The fan is for exhausting the air passing through the host. The second heat exchanger is disposed inside the casing and adjacent to the fan. The air exhausted by the fan is processed by the second heat exchanger for the heat exchange procedure, and then flows out of the casing by wind force of the fan.

According to the claimed invention, the air condition system further includes a stopper mechanism. The fan is disposed between the stopper mechanism and the second heat exchanger. The stopper mechanism controls flow rate of the air toward the second heat exchanger.

According to the claimed invention, part of the air flows toward the first heat exchanger via constraint of the stopper mechanism.

According to the claimed invention, the air from outward environment flowing into the casing and the air flowing toward the first heat exchanger via the stopper mechanism are processed by the first heat exchanger for the heat exchange procedure.

According to the claimed invention, the air condition system further includes a sensor electrically connected to the stopper mechanism. The sensor detects temperature of the air inside the casing so as to control the flow rate by the stopper mechanism.

According to the claimed invention, the air condition system further includes a coolant compression circulatory system connected between the first heat exchanger and the second heat exchanger.

According to the claimed invention, the coolant compression circulatory system cools and heats the air.

According to the claimed invention, the first heat exchanger guides the air from outward environment into the casing by natural convection.

According to the claimed invention, the fan exhausts the air passing through the host out of the casing through the second heat exchanger. The first heat exchanger cools and dehumidifies the air from outward environment, and guides the processed air to the host for cooling.

According to the claimed invention, the fan exhausts the air to the second heat exchanger for heating, and further exhausts the heated air to the host through the first heat exchanger for heating.

According to the claimed invention, the casing includes a main chamber and a first ventilator. The host is disposed inside the main chamber. The first ventilator is connected to the main chamber. The first heat exchanger, the fan and the second heat exchanger are disposed inside the first ventilator.

According to the claimed invention, the first ventilator includes a first zone and a second zone. The first zone is located by a lateral side of the main chamber, and the second zone is connected to an upper side of the main chamber.

According to the claimed invention, the air partly flows from the second zone to the first zone toward the first heat exchanger via constraint of the stopper mechanism.

According to the claimed invention, the air condition system further includes a first valve electrically connected to the sensor and disposed between the first zone and the second zone.

According to the claimed invention, the air condition system further includes a second valve electrically connected to the sensor and disposed between the main chamber and the first ventilator.

According to the claimed invention, the first heat exchanger is disposed on the first zone. The fan and the second heat exchanger are disposed on the second zone.

According to the claimed invention, the casing further includes a second ventilator disposed on a bottom of the main chamber.

The air condition system of the present invention sets the fan on the condenser (the second heat exchanger) instead of setting the fan on the evaporator (the first heat exchanger). The two heat exchangers can be both disposed inside the casing, and structural design of the ventilators, the stopper mechanism and the valves inside the casing can effectively guide the flow direction of the air, so that one fan is utilized in the air condition system of the present invention for temperature and humidity adjustment. The present invention further uses the coolant compression circulatory system to cool and to heat the air. The server rack and the container room with the air condition system of the present invention can be widely suitable to any place, such as the tropical district and the frigid district.

Comparing to the prior art with the indoor unit and the outdoor unit, the two heat exchangers of the air condition system of the present invention can be both disposed inside the casing. The present invention utilizes the fan adjacent to the second heat exchangers to guide the air from outward environment into the casing and to circulate the air inside the casing, so that the present invention can effectively decrease power usage effectiveness (PUE), and has advantages of low power consumption and preferred environment-friendly protection.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
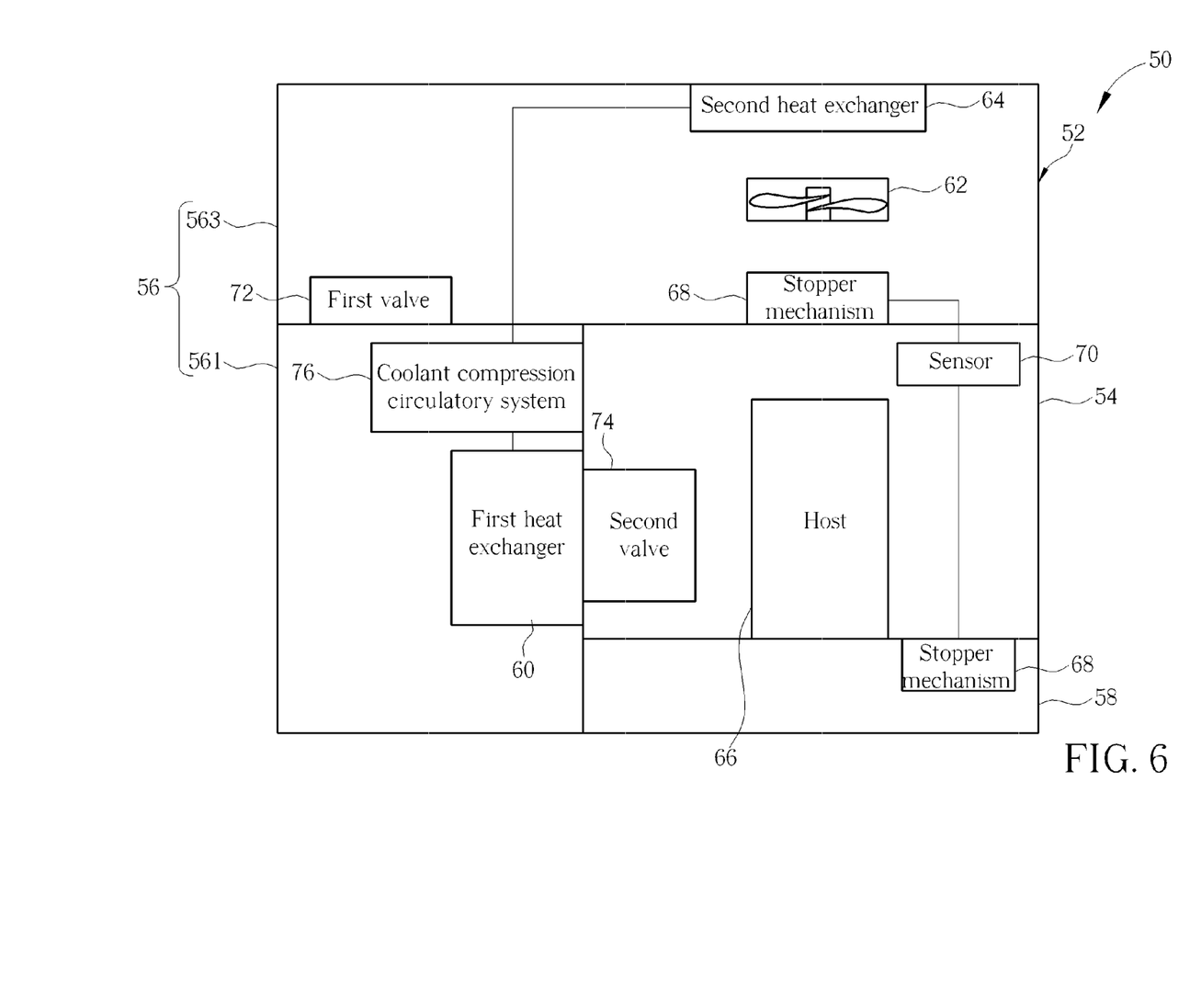
FIG. 6 is a diagram of an air condition system according to an embodiment of the present invention.

Please refer to FIG. 6. FIG. 6 is a diagram of an air condition system 50 according to an embodiment of the present invention. The air condition system 50 includes a casing 52 for holding elements of the air condition system 50. The casing 52 can include a main chamber 54, a first ventilator 56 and a second ventilator 58. The firs ventilator 56 is connected to the main chamber 54, and the second ventilator 58 is disposed on a bottom of the main chamber 54. The first ventilator 56 can include a first zone 561 and a second zone 563. The first zone 561 is located by a lateral side of the main chamber 54. The second zone 563 is located on an upper side of the main chamber 54. The air condition system 50 further includes a first heat exchanger 60, a fan 62 and a second heat exchanger 64. The first heat exchanger 60 is disposed on the first zone 561 of the first ventilator 56. The fan 62 is adjacent to the second heat exchanger 64. The fan 62 and the second heat exchanger 64 are disposed on the second zone 563 of the first ventilator 56.

The air condition system 50 can control environmental temperature of a host 66, so as to keep stable operation efficiency of the host 66 even though the host 66 is used in the tropical district or the frigid district. The host 66 is disposed inside the main chamber 54 of the casing 52, and the first heat exchanger 60 and the second heat exchanger 64 are disposed on different space of the casing 52. Therefore, positions of the first heat exchanger 60 and the second heat exchanger 64 of the present invention are not limited, which means the heat exchangers can be arbitrarily disposed inside or outside the casing 52. The air condition system 50 can be preferably applied to the server rack. As the first heat exchanger 60 and the second heat exchanger 64 are disposed inside the casing 52, the air condition system 50 and the host 66 can form a closed module, which is convenient to be moved and stacked, and conforms to a market trend of the server rack.

As shown in FIG. 6, the first heat exchanger 60 guides the air from outward environment into the casing 52 for heat exchange procedure. The air processed by the heat exchange procedure can flow into the main chamber 54 to warm or to cool the host 66. Then, the fan 62 adjacent to the second heat exchanger 64 can extract the air passing through the host 66 out of the main chamber 54, and further selectively exhaust all the air or part of the air toward the second heat exchanger 64 for the heat exchange procedure. Final, wind force of the fan 62 can exhaust the air out of the casing 52 to finish heat exchange circulation of the air condition system 50 of the present invention.

The air condition system 50 can further include a stopper mechanism 68 and a sensor 70. The fan 62 can be disposed between the stopper mechanism 68 and the second heat exchanger 64. The stopper mechanism 68 controls flow rate of the air toward the second heat exchanger 64 by the fan 62. The sensor 70 can be electrically connected to the stopper mechanism 68. The sensor 70 can detect temperature of the air inside the casing 52, so as to drive the stopper mechanism 68 to fully open, partly open or full close for controlling the flow rate of the air through the stopper mechanism 68. For example, the air can completely pass through the stopper mechanism 68 when the stopper mechanism 68 is fully open. The flow rate of the air corresponds to an open range of the stopper mechanism 68 when the stopper mechanism 68 is partly open. The air can not pass the stopper mechanism 68 when the stopper mechanism 68 is fully closed.

In addition, the air condition system 50 can further include a first valve 72 and a second valve 74 electrically connected to the sensor 70 (connection is not shown in figures). The first valve 72 is disposed inside the first ventilator 56 for controlling the flow rate between the first zone 561 and the second zone 563. The second valve 74 is disposed between the main chamber 54 and the first ventilator 56 for controlling the flow rate between the main chamber 54 and the first zone 561.

The air condition system 50 can further include a coolant compression circulatory system 76 bi-directionally connected between the first heat exchanger 60 and the second heat exchanger 64. The air condition system 50 utilizes the coolant compression circulatory system 76 to generate pressure variation between the first heat exchanger 60 and the second heat exchanger 64, so as to flow the coolant. The coolant can be pumped into cold heat exchanger (an evaporator), and the coolant can be evaporated by the low pressure and low temperature surrounding due to heat absorption. The evaporated coolant then flows into the other heat exchanger (a condenser), and the evaporated coolant can be condensed to liquid according to heat liberation, so as to complete a refrigeration cycle. Furthermore, a heating cycle can be executed when the coolant compression circulatory system 76 is operated reversely.

Figure 7:
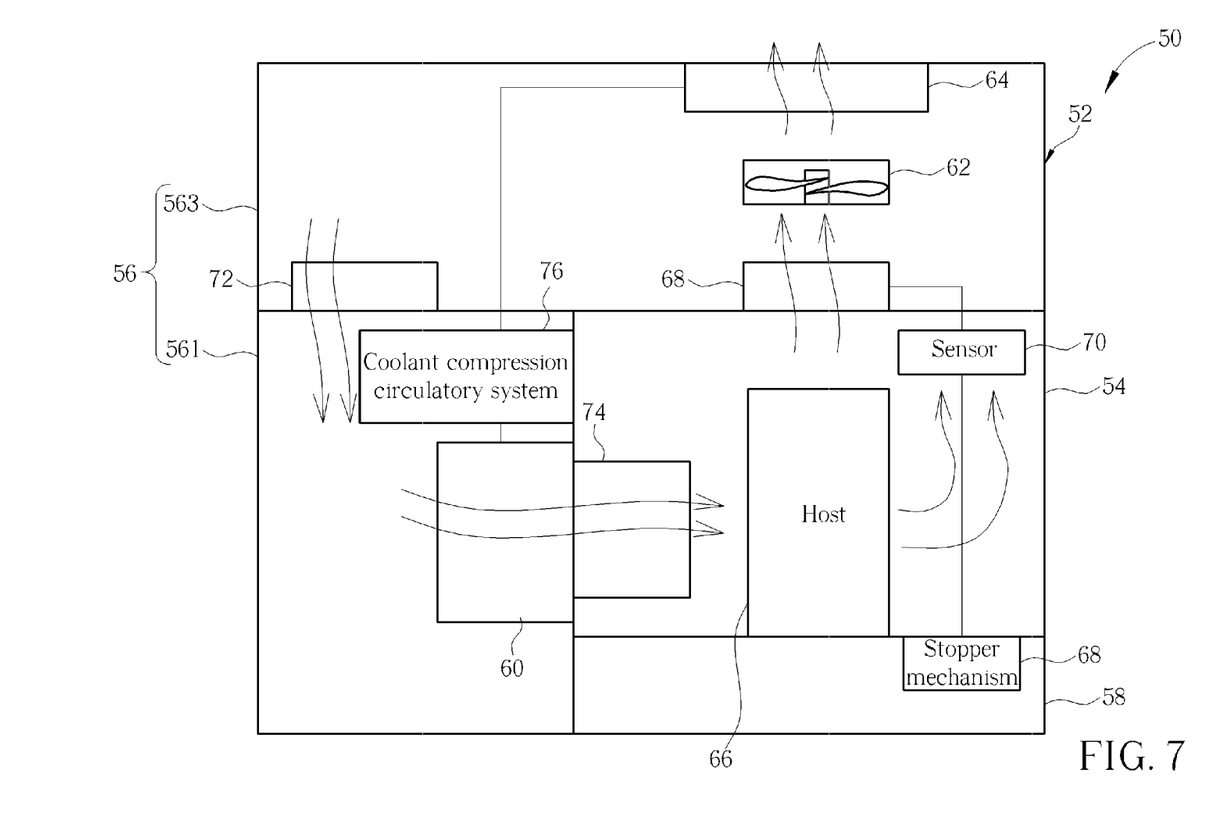
FIG. 7 is a diagram of the air condition system in cooling operational mode according to the embodiment of the present invention.

Please refer to FIG. 7. FIG. 7 is a diagram of the air condition system 50 in cooling operational mode according to the embodiment of the present invention. The first heat exchanger 60 guides the air from outward environment into the casing 52. An inlet of the casing 52 is generally disposed on the ceiling, such as the second zone 563. The air flows into the casing 52 and moves from the second zone 563 to the first zone 561 by natural convection. The air is cooled by the first heat exchanger 60 (the evaporator), and the evaporated air can flow into the main chamber 54 for cooling the host 66. Then, the air is exhausted out of the main chamber 54 by the fan 62, and flows toward the second heat exchanger 64 (the condenser) for condensation. It should be mentioned that the stopper mechanism 68 can be fully open when the cooling operational mode is executed, so that the fan 62 can exhaust all the air out of the casing 52 through the second heat exchanger 64. A flow direction of the air equals an arrow shown in FIG. 7.

Figure 8:
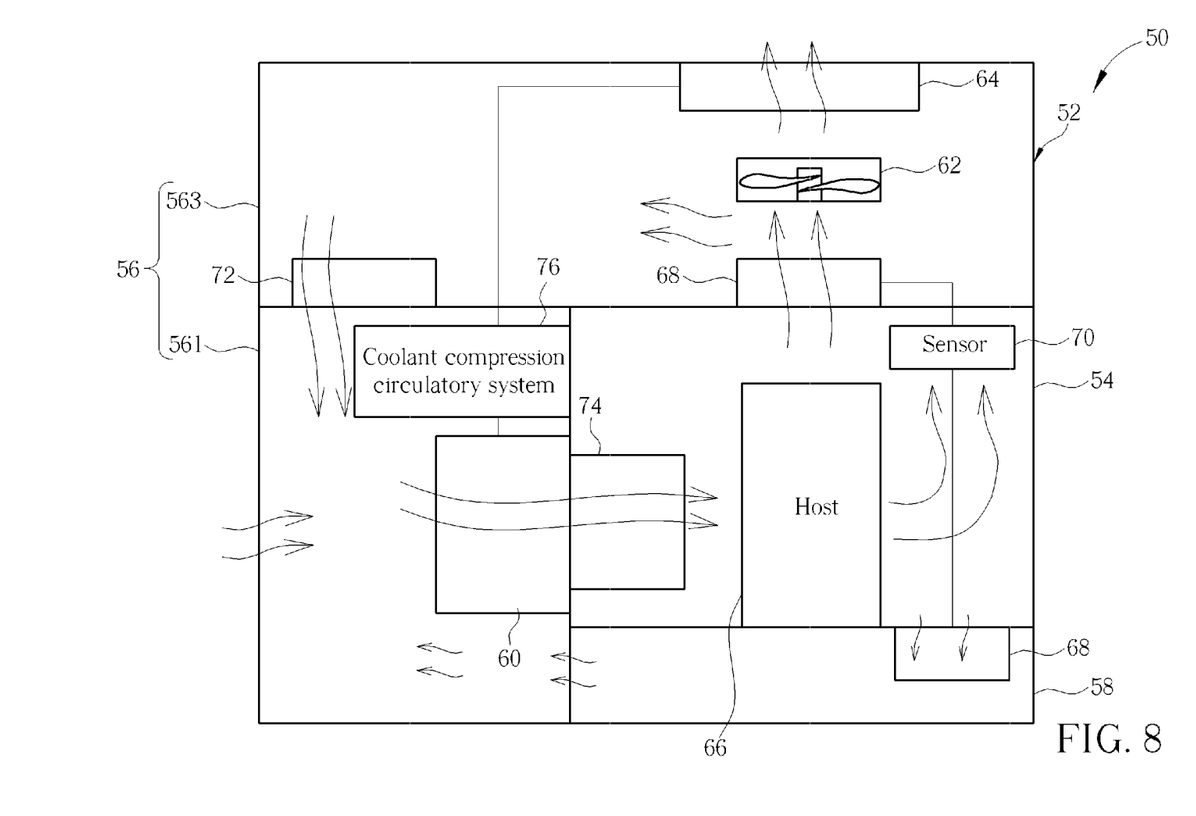
FIG. 8 is a diagram of the air condition system in heating operational mode according to the embodiment of the present invention.

Please refer to FIG. 8. FIG. 8 is a diagram of the air condition system 50 in heating operational mode according to the embodiment of the present invention. The first heat exchanger 60 can guide the air from outward environment into the casing 52 toward the first zone 561 of the first ventilator 56. The first heat exchanger 60 becomes a high pressure end by the coolant compression circulatory system 76, pressure of the first heat exchanger 60 and the second heat exchanger 64 are reversed. Therefore, the air can be heated by the first heat exchanger 60 (the condenser). The coolant compression circulatory system 76 can absorb heat from the surrounding to rapidly heat the air. The heated air flows from the first ventilator 56 to the main chamber 54 for heating the host 66. The air is exhausted out of the main chamber 54 by the fan 62. Meanwhile, the stopper mechanism 68 can preferably be partly open, the air inside the main chamber 54 can be partly out of the casing 52, and the other part of the air can flow back to the first zone 561 from the second zone 563 by the fan 62. The air inside the first zone 561 can be processed by the first heat exchanger 60 for the heat exchange procedure.

Besides, the second ventilator 58 can be disposed on the bottom of the main chamber 54, and the stopper mechanism 68 can be selectively disposed between the main chamber 54 and the second ventilator 58. As heat function of the air condition system 50 is actuated, the hot air inside the main chamber 54 can partly flow toward the second ventilator 58 through the stopper mechanism 68, and further flow toward the first zone 561 of the first ventilator 56 for the heat exchange procedure by the first heat exchanger 60. Disposition of the second ventilator 58 corresponds to design demand, and detailed description is omitted for simplicity. The flow direction of the air equals an arrow shown in FIG. 8.

In conclusion, the air condition system of the present invention sets the fan on the condenser (the second heat exchanger) instead of setting the fan on the evaporator (the first heat exchanger). The two heat exchangers can be both disposed inside the casing, and structural design of the ventilators, the stopper mechanism and the valves inside the casing can effectively guide the flow direction of the air, so that one fan is utilized in the air condition system of the present invention for temperature and humidity adjustment. The present invention further uses the coolant compression circulatory system to cool and to heat the air. The server rack and the container room with the air condition system of the present invention can be widely suitable to any place, such as the tropical district and the frigid district.

Comparing to the prior art with the indoor unit and the outdoor unit, the two heat exchangers of the air condition system of the present invention can be both disposed inside the casing. The present invention utilizes the fan adjacent to the second heat exchangers to guide the air from outward environment into the casing and to circulate the air inside the casing, so that the present invention can effectively decrease power usage effectiveness (PUE), and has advantages of low power consumption and preferred environment-friendly protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An air condition system comprising:
a casing, comprising a main chamber and a first ventilator connected to each other a host being disposed inside the main chamber;
a first heat exchanger disposed inside the first ventilator, the first heat exchanger guiding air from outward environment into the casing for heat exchange procedure, and the air processed by the heat exchange procedure flowing toward the host;
a fan disposed inside the first ventilator for exhausting the air passing through the host; and
a second heat exchanger disposed inside the first ventilator and adjacent to the fan, the air exhausted by the fan being processed by the second heat exchanger for the heat exchange procedure, and flowing out of the casing by wind force of the fan.

2. The air condition system of claim 1, further comprising:
a stopper mechanism, the fan being disposed between the stopper mechanism and the second heat exchanger, the stopper mechanism controlling flow rate of the air toward the second heat exchanger.

3. The air condition system of claim 2, wherein part of the air flows toward the first heat exchanger via constraint of the stopper mechanism.

4. The air condition system of claim 3, wherein the air from outward environment flowing into the casing and the air flowing toward the first heat exchanger via the stopper mechanism are processed by the first heat exchanger for the heat exchange procedure.

5. The air condition system of claim 2, further comprising:
a sensor electrically connected to the stopper mechanism, the sensor detecting temperature of the air inside the casing so as to control the flow rate by the stopper mechanism.

6. The air condition system of claim 5, wherein the first ventilator comprises a first zone and a second zone, the first zone is located by a lateral side of the main chamber, and the second zone is connected to an upper side of the main chamber.

7. The air condition system of claim 6, wherein the air partly flows from the second zone to the first zone toward the first heat exchanger via constraint of the stopper mechanism.

8. The air condition system of claim 6, further comprising:
a first valve electrically connected to the sensor and disposed between the first zone and the second zone.

9. The air condition system of claim 8, further comprising:
a second valve electrically connected to the sensor and disposed between the main chamber and the first ventilator.

10. The air condition system of claim 6, wherein the first heat exchanger is disposed on the first zone, the fan and second heat exchanger are disposed on the second zone.

11. The air condition system of claim 2, wherein the fan exhausts the air to the second heat exchanger for heating, and further exhausts the heated air to the host through the first heat exchanger for heating.

12. The air condition system of claim 1, further comprising:
a coolant compression circulatory system connected between the first heat exchanger and the second heat exchanger.

13. The air condition system of claim 12, wherein the coolant compression circulatory system cools and heats the air.

14. The air condition system of claim 1, wherein the fan exhausts the air passing through the host out of the casing through the second heat exchanger, the first heat exchanger cools and dehumidifies the air from outward environment, and guides the processed air to the host for cooling.

15. The air condition system of claim 1, wherein the casing further comprises:
a second ventilator disposed on a bottom of the main chamber.

16. The air condition system of claim 1, wherein the air condition system further comprises a stopper mechanism, a sensor and a coolant compression circulatory system, the fan is disposed between the stopper mechanism and the second heat exchanger, the sensor is electrically connected to the stopper mechanism, the coolant compression circulatory system is connected between the first heat exchanger and the second heat exchanger, the casing comprises a main chamber, a first ventilator and a second ventilator, the host is disposed inside the main chamber, the first heat exchanger, the fan and the second heat exchanger are disposed on a bottom of the main chamber, the first ventilator comprises a first zone and a second zone, the first zone is located by a lateral side of the main chamber, the second zone is connected to an upper side of the main chamber, the air condition system further comprises a first valve and a second valve electrically connected to the sensor, the first valve is disposed between the first zone and the second zone, and the second valve is disposed between the main chamber and the first ventilator.

17. An air condition system comprising:
a casing, a host being disposed inside the casing;
a first heat exchanger disposed inside the casing, the first heat exchanger guiding air from outward environment into the casing for heat exchange procedure, and the air processed by the heat exchange procedure flowing toward the host;
a fan for exhausting the air passing through the host;
a second heat exchanger disposed inside the casing and adjacent to the fan, the air exhausted by the fan being processed by the second heat exchanger for the heat exchange procedure, and flowing out of the casing by wind force of the fan; and
a stopper mechanism, the fan being disposed between the stopper mechanism and the second heat exchanger, the stopper mechanism controlling flow rate of the air toward the second heat exchanger.

* * * * *